(12) United States Patent
Ribeyron et al.

(10) Patent No.: US 7,759,231 B2
(45) Date of Patent: Jul. 20, 2010

(54) METHOD FOR PRODUCING METAL/SEMICONDUCTOR CONTACTS THROUGH A DIELECTRIC

(75) Inventors: Pierre Jean Ribeyron, Saint Ismier (FR); Emmanuel Rolland, Jarrie (FR)

(73) Assignee: Commissariat a l'Energie Atomique, Paris (FR)

( * ) Notice: Subject to any disclaimer, the term of this patent is extended or adjusted under 35 U.S.C. 154(b) by 532 days.

(21) Appl. No.: 11/814,690

(22) PCT Filed: Feb. 6, 2006

(86) PCT No.: PCT/FR2006/050101

§ 371 (c)(1), (2), (4) Date: Jul. 25, 2007

(87) PCT Pub. No.: WO2006/085021

PCT Pub. Date: Aug. 17, 2006

(65) Prior Publication Data

US 2008/0132054 A1 Jun. 5, 2008

(30) Foreign Application Priority Data

Feb. 8, 2005 (FR) .................................. 05 50357

(51) Int. Cl.
*H01L 21/60* (2006.01)
(52) U.S. Cl. ...................... 438/571; 438/573; 438/597; 438/598; 136/256
(58) Field of Classification Search ................. 438/571, 438/573, 597, 598; 136/256; 29/840, 843, 29/860, 877, 878
See application file for complete search history.

(56) References Cited

U.S. PATENT DOCUMENTS

| 4,626,613 A | 12/1986 | Wenham et al. |
| 4,703,553 A | 11/1987 | Mardesich |
| 5,011,565 A | 4/1991 | Dube et al. |

(Continued)

FOREIGN PATENT DOCUMENTS

EP   1 319 254 A   6/2003

(Continued)

OTHER PUBLICATIONS

Anita Ho, Stuart Wenham. "Fabrication of Silicon Solar Cells with Rear Pinhole Contacts", 2007, Solar Energy Materials and Solar Cells, vol. 91, pp. 1234-1242.*

(Continued)

*Primary Examiner*—David Vu
*Assistant Examiner*—Suberr Chi
(74) *Attorney, Agent, or Firm*—Oblon, Spivak, McClelland, Maier & Neustadt, L.L.P.

(57) ABSTRACT

A method of forming contacts between at least one metallic layer and at least one semiconductor substrate through at least one layer of dielectric in a semiconductor device. The semiconductor device includes, on at least one base face of the semiconductor substrate, the dielectric layer. The metallic layer is stacked on the dielectric layer. The heated ends of plural protruding elements assembled on a support are brought into contact with the metallic layer simultaneously, thereby creating zones of melted metal under the heated ends of the protruding elements. The melted metal traverses the dielectric and amalgamates with the semiconductor of the substrate at the level of the zones of melted metal, thereby creating the contacts.

18 Claims, 3 Drawing Sheets

U.S. PATENT DOCUMENTS

2002/0153039 A1 10/2002 Moon et al.
2004/0097062 A1 5/2004 Preu et al.

FOREIGN PATENT DOCUMENTS

WO      WO 02/25742 A2    3/2002

OTHER PUBLICATIONS

Anita Wing Yi Ho, et al, "Buried contact solar cells with innovative rear localised contacts", Progress in Photovoltaics: Research and Applications, XP002349703, vol. 12, No. 4, Jun. 2004, pp. 297-308.
E. Schneiderloechner, et al., "Laser-Fired Rear contacts for crystalline silicon solar cells", Progress in Photovoltaics: Research and Applications, XP001112408, vol. 10, No. 1, Jan. 2002, pp. 29-34.
Axel Metz, et. al, "High-quality passivated rear contact structure for silicon solar cells based on simple mechanical abrasion", Conference Record of the 28$^{th}$ IEEE Photovoltaic Specialists Conference, XP002349704, 2000, pp. 172-175.
R. Preu, et. al, "Laser ablation—a new low-cost approach for passivated rear contact formation in crystalline silicon solar cell technology", Proceedins of the European Photovoltaic Solar Energy Conference, XP002200822, vol. II, May 1, 2000, pp. 1181-1184.
Jiun-Hua Guo, et al. "Laser-Grooved backside contact solar cells with 680-mV open-circuit voltage", IEEE Transactions of Electron Devices, XP001214247, vol. 51, No. 12, Dec. 2004, pp. 2186-2192.
I. S. Moon, et al., "New method for patterning the rear passivation layers of high-efficiency solar cells", Journal of Materials Science: Materials in Electronics, XP002349705, vol. 12, No. 10, Oct. 2001, pp. 605-607.
J. E. Cotter, et al., "Novel processes for simplified buried contact solar cells", Conference Record of the 28$^{th}$ IEEE Photovoltaic Specialists Conference, XP002200820, vol. Conf. 28, Sep. 15, 2000, pp. 303-306.

* cited by examiner

METHOD FOR PRODUCING METAL/SEMICONDUCTOR CONTACTS THROUGH A DIELECTRIC

TECHNICAL FIELD

The present invention concerns a method of forming metal/semiconductor contacts through a dielectric, specially adapted to the formation of semiconductor devices. Such a method may be, for example, used for the formation of metal/semiconductor contacts on the back face of a homojunction solar cell.

STATE OF THE PRIOR ART

The manufacture of solar cells at the industrial level pursues two objectives: to increase the efficiency of solar cells and to increase the productivity of manufacturing these solar cells. The majority of solar cells manufactured are based on crystalline silicon. One distinguishes two types of solar cells: heterojunction solar cells and homojunction solar cells.

The conventional method of manufacturing a crystalline silicon homojunction solar cell is as follows:

a substrate of silicon doped N or P is placed in a diffusion furnace to form, on one of its faces, a zone doped P+ if the silicon is doped N, or N+ if the silicon is doped P. This face of the substrate is known as "emitter". It is located on the side of the front face of the solar cell. A metallic layer, for example in aluminium, is deposited on another face, opposite to the emitter. This other face is known as "base". The substrate and the metallic layer are annealed in order to overdope the base of the substrate of the same type of conductivity as the substrate. A zone doped N+ if the silicon is doped N, or P+ if the silicon is doped P, forms on all the base of the substrate. This heat treatment makes it possible to assure a good contact between the metallic layer and the base of the substrate. An antireflective layer is then deposited on the emitter of the semiconductor substrate. This antireflective layer makes it possible to assure a minimum optical loss by "trapping" the photons within the interior of the solar cell. This layer may, for example, be formed in silicon nitride or in titanium oxide. A metallic grid is then formed on the antireflective layer. This metallic grid must assure a minimum shading of the front face so that the surface of the emitter exposed to the light is as large as possible. It is annealed so that it traverses the antireflective layer and comes into contact with the emitter of the semiconductor substrate.

In order to obtain a better efficiency, the back face of the solar cell must not be contacted entirely by the metallic layer in aluminium. Indeed, to obtain a high efficiency cell, it is not enough to have a good contact between the different layers of the cell. It is also necessary that the surfaces, and in particular the back face, are perfectly passivated. A good surface passivation signifies that the minority carriers, in other words the electrons in the type P silicon, created by the absorption of photons by the solar cell are not going to, or are going to very little, recombine at the considered surface. In industrial solar cells, the passivation of the back face is achieved by a BSF (back surface field) effect. This BSF is created by an annealing of the metallic layer in aluminium located on the base of the substrate, which induces an overdoping of the same type of conductivity as the substrate on all the surface of the base.

However, this surface passivation by overdoping of all the surface of the base of the substrate is not as efficient as surface passivation by dielectric. Surface passivation by dielectric consists in depositing on the surface to be passivated a layer of dielectric. The dielectric used may be for example of silicon oxide or of silicon nitride.

The best compromise is therefore to contact a fraction of the back face of the solar cell with a metal in order to obtain metal/semiconductor contact points, and to occupy the remainder of this back face by a deposition of dielectric having the best possible characteristics in terms of surface passivation. This structure is more complex to implement than that using an overdoping of the entire surface to be passivated. It usually necessitates using costly photolithography steps.

The U.S. Pat. Nos. 4,626,613 and 5,011,565 describe solar cells having metal/semiconductor contact points through a dielectric layer. In these two patents, the dielectric is firstly deposited on the base of the substrate of silicon. A laser then engraves through the dielectric the spaces of the metallic contacts. Finally, the metal is deposited in the engraved spaces. This method has the disadvantage that the substrate is damaged by the laser and that an additional step of etching in the spaces of the metallic contacts is necessary to enable a contact of good quality.

The patent EP-A1-1319254 also describes a solar cell having metal/semiconductor contacts through a dielectric layer. The dielectric is deposited on one face of a silicon substrate. A metallic layer is then deposited on the dielectric layer by cathodic sputtering or evaporation. A laser source then forms irregular contacts by locally heating the metallic layer. The metal melted by the laser source traverses the dielectric and amalgamates with the silicon to create the metal/semiconductor contacts. The major disadvantage of this method is that it does not make it possible to have a good productivity. Indeed, the laser must form between 100 and more than 500 melting points per cell, which requires a long formation time. Moreover, the laser can damage the metallic surface, creating an overthickness on the back face of the cell, source of deterioration during the interconnection between several cells.

DESCRIPTION OF THE INVENTION

The aim of the present invention is to propose a method of forming metal/semiconductor contacts through a dielectric for a semiconductor device, which does not have the disadvantages of prior methods of forming metal/semiconductor contacts through a dielectric, particularly their reduced productivity and their risks of deterioration on the devices formed.

To attain these aims, the present invention proposes a method of forming contacts between at least one metallic layer and at least one semiconductor substrate through at least one layer of dielectric in a semiconductor device that comprises, on at least one face, known as "base", of the semiconductor substrate, the dielectric layer on which is stacked the metallic layer. Heated ends of several protruding elements assembled on a support are brought into contact with the metallic layer simultaneously, thereby creating zones of melted metal under the heated ends of the protruding elements, the melted metal traversing the dielectric and amalgamating with the semiconductor of the substrate at the level of the zones of melted metal, thereby creating the contacts.

Thus, instead of forming successive irregular contacts on a semiconductor device, between a layer of semiconductor and a metallic layer, through a layer of dielectric, with a laser source, one forms all the contacts in one go by using protruding elements, the heated ends of which are placed against the metallic layer simultaneously. Under these heated ends, zones of melted metal then form by conduction, traversing the dielectric and amalgamating with the semiconductor of the substrate, thereby creating the contacts between the metallic layer and the semiconductor. The dielectric layer assures the passivation of the back face of the semiconductor substrate.

It is preferable that the protruding elements are arranged in a matrix on the support.

One may envisage that the ends of the protruding elements are heated to a temperature between around 577° C. and 1000° C., in order to rapidly melt the metallic layer.

It is preferable that the application time of the heated ends of the protruding elements against the metallic layer is between around 0.5 second and 10 seconds.

The number of protruding elements, used for a surface area of semiconductor substrate of around 1 m$^2$, may be for example between around 500 and 35000.

The ends of the protruding elements may be of substantially circular shape, the diameter of which may be between around 50 micrometers and 1 millimeter, or substantially of quadrilateral shape, the sides of which may have a dimension between around 50 micrometers and 1 millimeter. The shape of the ends of the protruding elements is identical to the shape of the metal/semiconductor contacts formed by these protruding elements.

It is preferable that the semiconductor substrate is a crystalline substrate.

The semiconductor substrate may be for example in monocrystalline silicon or in polycrystalline silicon.

One may envisage that the dielectric layer is in silicon oxide or in silicon nitride.

The dielectric layer is preferably deposited on the semiconductor substrate by a technique of plasma enhanced chemical vapour deposition.

The metallic layer may be for example deposited on the dielectric layer by evaporation, sputtering or serigraphy.

One may envisage that the metallic layer has a thickness of between around 1 micrometer and 5 micrometers.

The metallic layer may be based on a doping material such as aluminium.

It is then preferable that the semiconductor substrate is of a first type of conductivity and that during the method of formation of the contacts, the melted metal creates overdoping zones of the first type of conductivity in the semiconductor substrate, around the metal/semiconductor contacts. These zones thereby make it possible to have a good contact between the metallic layer and the semiconductor substrate.

The present invention further concerns a method of forming a semiconductor device comprising contacts formed according to the method described previously, in which the semiconductor substrate is preferably of a first type of conductivity. This method of forming a semiconductor device may comprise the following steps:

a) heat treatment of the semiconductor substrate, forming, under another face known as "emitter", opposite to the base, an overdoped region of a second type of conductivity, opposite to the first type of conductivity;

b) formation of an antireflective layer on the emitter of the semiconductor substrate;

c) deposition of a metallic grid on the antireflective layer;

d) bringing into contact the metallic grid with the emitter of the semiconductor substrate through the antireflective layer.

The bringing into contact of the metallic grid with the emitter of the semiconductor substrate through the antireflective layer may be achieved by a heat treatment of the metallic grid.

The metallic grid may for example be based on a noble metal such as silver. This metallic grid is one of the two electrodes of the semiconductor device, the other being the metallic layer.

The antireflective layer may for example be in silicon nitride or in titanium oxide.

Such a semiconductor device may advantageously be a solar cell.

The present invention further concerns a device with protruding elements for the implementation of the method described previously. One may envisage that this device comprises protruding elements assembled on a common support including heating means.

The ends of the protruding elements may be pointed.

The protruding elements may be formed based on graphite or tungsten.

It is preferable that the heating means are a resistive or inductive element.

BRIEF DESCRIPTION OF DRAWINGS

The present invention will be better understood after reading the description of formation examples given purely for information and that is in no way limitative, with reference to the appended figures, wherein:

FIG. 1 further comprises protruding elements, used during the method of forming metal/semiconductor contacts through the dielectric;

Identical, similar or equivalent parts of the different figures described hereafter have the same numerical references so as to facilitate the transfer from one figure to the next.

The different parts shown in the figures are not necessarily all to the same scale, to make the figures more easily understandable.

DETAILED DESCRIPTION OF SPECIFIC EMBODIMENTS

Figure 1:
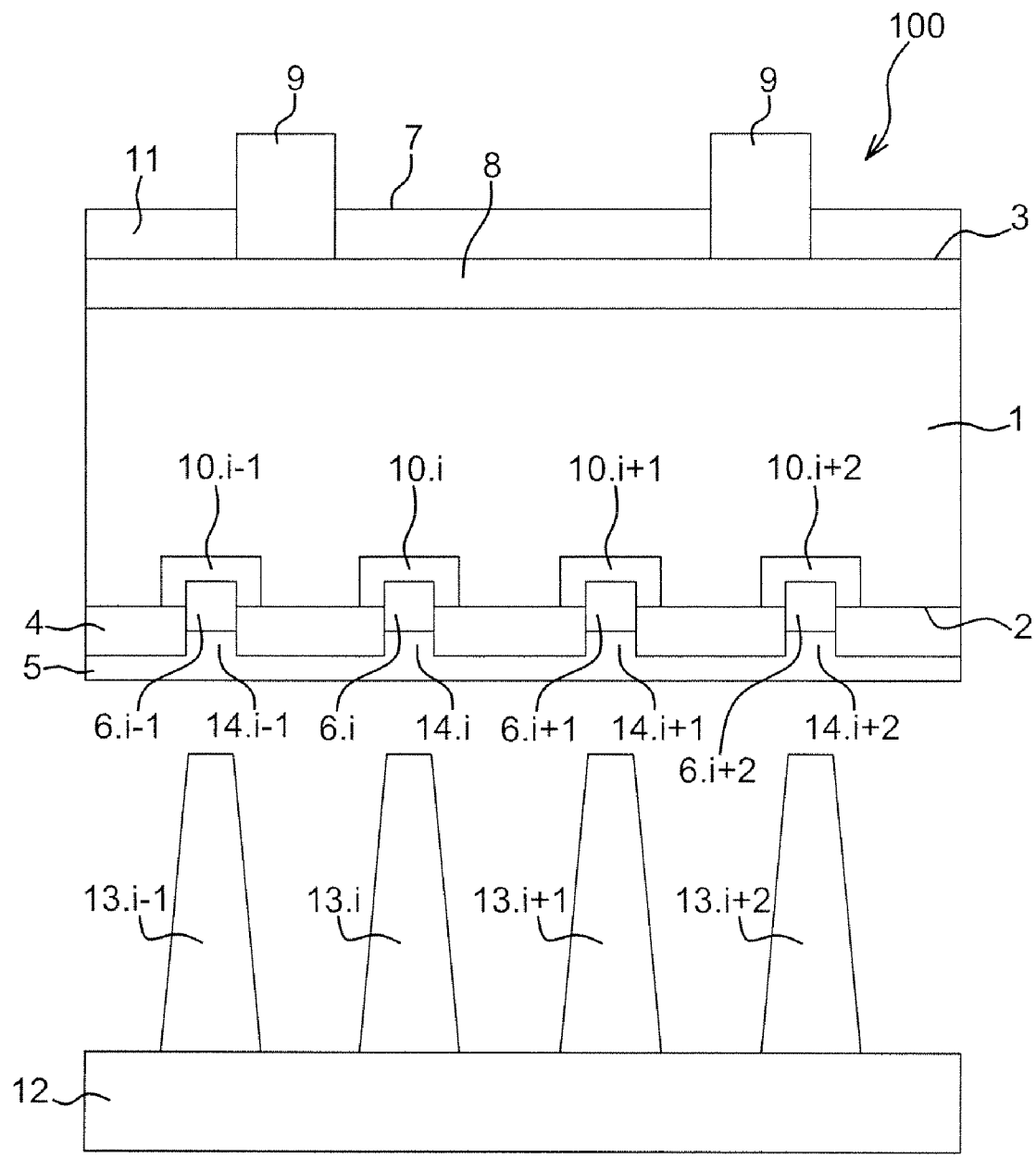
FIG. 1 shows in section an example of semiconductor device comprising metal/semiconductor contacts through a dielectric formed according to a method of formation, subject of the present invention.

One refers to FIG. 1, which shows in section an example of semiconductor device 100 formed according to a method of formation, subject of the present invention. It comprises on at least one face 2, known as "base", of a semiconductor substrate 1, a layer of dielectric 4. On this layer of dielectric 4 is stacked a metallic layer 5. The semiconductor device 100 further comprises contacts 6.1 to 6.n between the metallic layer 5 and the semiconductor substrate 1, traversing the dielectric layer 4, formed according to a method of formation, also subject of the present invention. In FIG. 1, only four contacts 6.i−1, 6.i, 6.i+1, 6.i+2 forming part of the series of contacts 6.1 to 6.n are shown. In this example, it is a solar cell, but it could be another semiconductor device.

The semiconductor substrate 1 may be a crystalline substrate, for example in monocrystalline silicon or in polycrystalline silicon. It may also be, for example, in thin film. It has a first type of conductivity. In the example illustrated in FIG. 1, the semiconductor substrate 1 is of crystalline silicon of type P. The thickness of the semiconductor substrate 1 may be between 10 micrometers and several hundreds of micrometers.

The semiconductor substrate 1 further comprises another face 3 known as "emitter", opposite to the base 2. This emitter 3 is on the side of a front face 7 of the semiconductor device 100. The example of semiconductor device 100 of FIG. 1 being a solar cell, it is this front face 7 that is exposed to light.

The semiconductor device 100 comprises under the emitter 3 of the semiconductor substrate 1 an overdoped region 8 of a second type of conductivity, opposite to the first type of conductivity. In the example of FIG. 1, it is thus a region 8 doped N+. This region is formed by a heat treatment, for example in a diffusion furnace, of the semiconductor substrate 1.

An antireflective layer 11 is then deposited on the region 8 of the semiconductor substrate 1. This antireflective layer 11 makes it possible to assure a minimum optical loss by "trapping" the photons within the interior of the semiconductor device 100. This layer 11 may, for example, be formed in silicon nitride or in titanium oxide.

A metallic grid 9 is then formed on the antireflective layer 11. This metallic grid 9 is the second electrode of the semiconductor device 100. It is formed for example based on a noble metal such as silver. It must assure a minimum shading of the front face 7 so that the surface of said front face 7 exposed to light is as large as possible. This metallic grid 9 is for example formed by a deposition of serigraphy paste that is then annealed so that it traverses the antireflective layer 11 and comes into contact with the region 8.

Figure 2A:
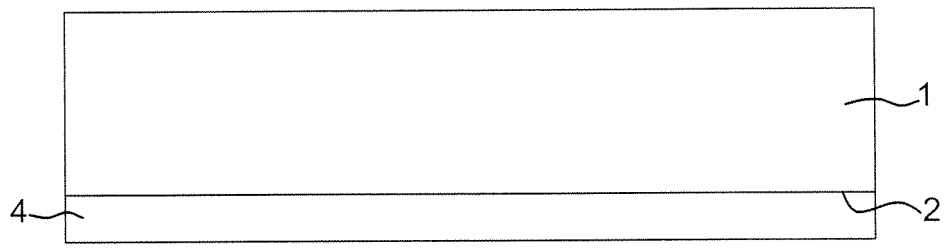
FIGS. 2A to 2C show section views of steps of a method of forming metal/semiconductor contacts through a dielectric, subject of the present invention
Figure 2B:
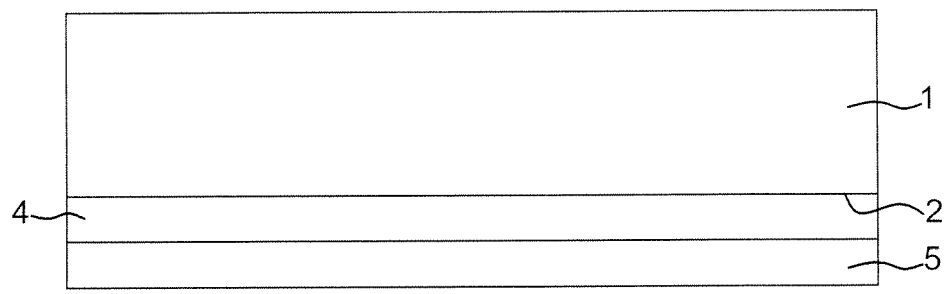
Figure 2C:
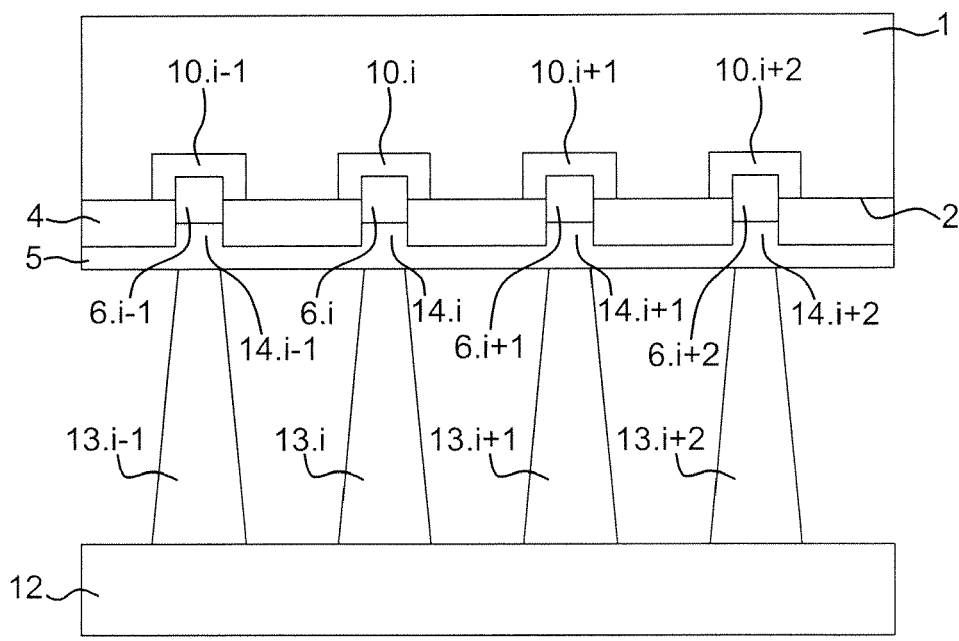

We will now take an interest in the method of forming metal/semiconductor contacts through a dielectric, also subject of the present invention, forming part of the method of forming the semiconductor device 100 of FIG. 1. In FIGS. 2A to 2C, only the semiconductor substrate 1 and the elements of the semiconductor device 100 located on the side of the base 2 of the semiconductor substrate 1 are shown. Indeed, the elements shown in FIG. 1 located on the side of the emitter 3 of the semiconductor substrate 1 are only a preferred embodiment of the semiconductor device 100.

As one may see in FIG. 2A, at least the dielectric layer 4 is firstly deposited on at least the base 2 of the semiconductor substrate 1. This layer of dielectric 4 makes it possible to assure a good passivation of the base 2 of the semiconductor substrate 1. This signifies that the minority carriers created by the absorption of photons are not going to, or are very little going to, recombine at the surface considered, in other words the base 2 of the semiconductor substrate 1. In the example shown in FIGS. 1 to 2C, the dielectric layer 4 is in silicon nitride or in silicon oxide. The deposition of this layer of dielectric 4 is for example achieved by a technique of PECVD (Plasma Enhanced Chemical Vapour Deposition), or any other appropriate technique. The thickness of this layer of dielectric 4 is between around 5 nanometers and 100 nanometers.

The semiconductor substrate 1 and the dielectric layer 4 are then annealed at a temperature of around 400° C. to improve the passivation properties of the dielectric layer 4.

A metallic layer 5 is then stacked on the dielectric layer 4, as is illustrated in FIG. 2B. This metallic layer 5 is one of two electrodes of the semiconductor device 100. In the example of this FIG. 2B, the metallic layer 5 is in aluminium. It is deposited by evaporation, sputtering or even by serigraphy. Its thickness is between around 1 micrometers and 5 micrometers.

Several heated ends of protruding elements 13.1 to 13.$n$ are then applied simultaneously against the metallic layer 5. In FIG. 2C and in FIG. 1, these protruding elements are arranged in a matrix on a same support 12. Their ends are for example pointed. In these two figures, only four protruding elements 13.$i$−1, 13.$i$, 13.$i$+1, 13.$i$+2 are shown on the support 12. The metallic layer 5 located under the heated ends of the protruding elements 13.1 to 13.$n$ begin to melt slightly by radiation when the heated ends are brought closer to the surface of the metal. When the heated ends of the protruding elements 13.1 to 13.$n$ are brought into contact with the metallic layer 5, the metal located under the heated ends rapidly melts by conduction to form zones of melted metal 14.1 to 14.$n$. A part of the melted metal touching the semiconductor of the substrate 1 then amalgamates with it and forms contacts 6.1 to 6.$n$ electrically connecting the semiconductor substrate 1 and the metallic layer 5. The number of contacts 6.1 to 6.$n$ is equal to the number of protruding elements 13.1 to 13.$n$ that comprises the support 12. The application time of the heated ends of the protruding elements 13.1 to 13.$n$ against the metallic layer 5 is for example between around 0.5 second and 10 seconds. These protruding elements 13.1 to 13.$n$ are heated to a temperature between around 577° C. and 1000° C. During this application time, if the metallic layer 5 has doping properties, as in the example of FIG. 2C and FIG. 1 in which the metallic layer 5 is in aluminium, and that the semiconductor substrate 1 is of a first type of conductivity, overdoping zones 10.1 to 10.$n$ of the first type of conductivity form around the contacts 6.1 to 6.$n$. These overdoping zones 10.1 to 10.$n$ make it possible to assure a better contact between the semiconductor substrate 1 and the metallic layer 5.

After the formation of contacts 6.1 to 6.$n$, the metal of the zones of melted metal 14.1 to 14.$n$ that has not amalgamated with the semiconductor of the substrate 1 solidifies to return to the same state as the rest of the metal of the metallic layer 5.

Figure 3A:
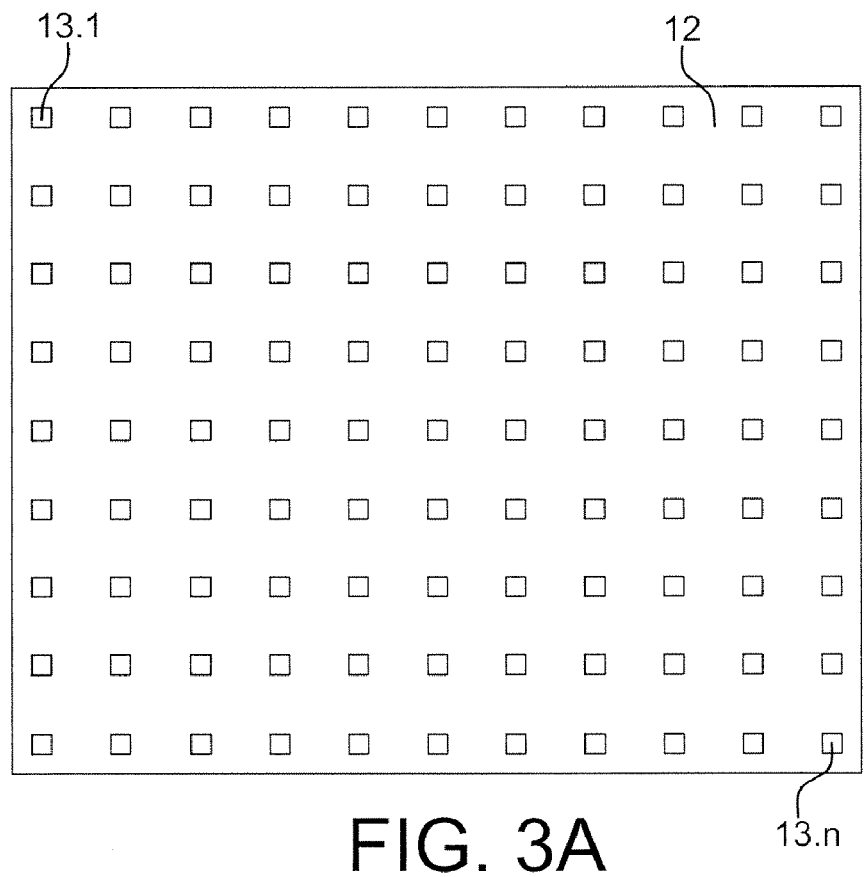
FIG. 3A shows a bottom view of protruding elements arranged in a matrix on a same support.
Figure 3B:
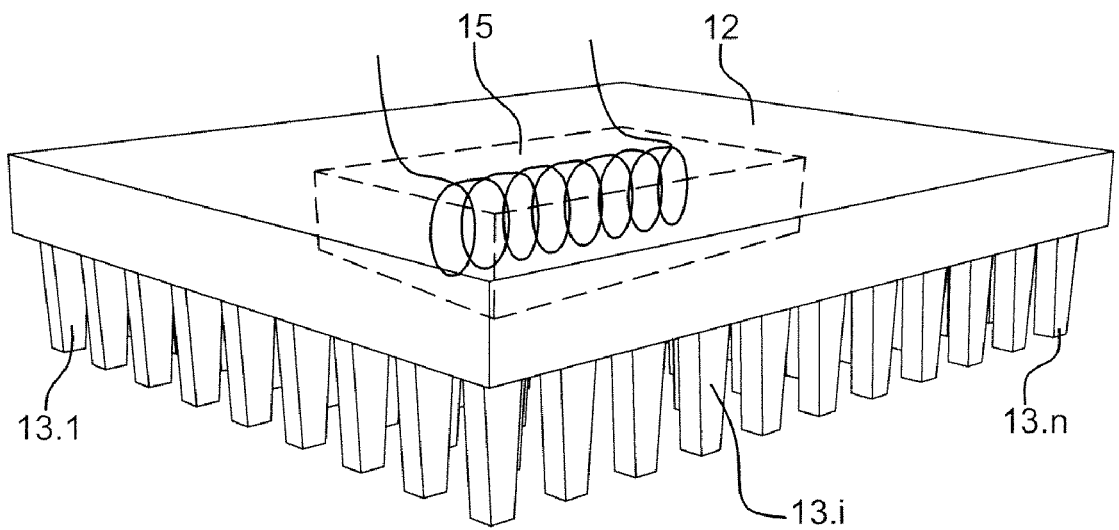
FIG. 3B shows a perspective view of protruding elements arranged in a matrix on a same support.

The surfaces of the contacts 6.1 to 6.$n$ located against the metallic layer 5 have the same shape as the ends of the protruding elements 13.1 to 13.$n$. In FIGS. 3A and 3B is illustrated an example of support 12 and protruding elements 13.1 to 13.$n$, seen from below and seen in perspective. One sees that the protruding elements 13.1 to 13.$n$ each have an end of square shape, the sides of which have a dimension of around 250 micrometers. They are arranged in a matrix, regularly spaced at a distance equal to around 2 millimeters. In a general manner, the ends of the protruding elements 13.1 to 13.$n$ may be of substantially quadrilateral shape, the sides of which have a dimension between around 50 micrometers and 1 millimeter, or of substantially circular shape, the diameter of which is between around 50 micrometers and 1 millimeter. Between around 500 and 35000 protruding elements may be used for a surface area of semiconductor substrate of around 1 m². The protruding elements 13.1 to 13.$n$ are for example formed based on graphite or tungsten.

A first method of manufacture consists in using a grinder that is going to directly create the protruding elements 13.1 to 13.$n$ from a solid block of graphite or tungsten. In this method of manufacture, the support 12 and the protruding elements 13.1 to 13.$n$ are formed from a same block of graphite or tungsten. A second method of manufacture consists in forming holes in a block of graphite or tungsten, which is the support 12. These holes are formed according to the pattern of the matrix of the protruding elements 13.1 to 13.$n$. These protruding elements 13.1 to 13.$n$, formed from another block of graphite or tungsten, are then inserted into the previously formed holes. In these two methods of manufacture, heating means 15, such as for example a resistance in FIG. 3B, are then integrated within the interior of the support 12. It is these heating means 15 that enable the protruding elements 13.1 to 13.*n* to be heated. More generally, these heating means may be for example an inductive or resistive element.

The advantage of this method is that it is rapid since the treatment of the substrate of semiconductor is carried out in a single operation. Moreover, it is easily automatable and enables a significant gain in terms of efficiency while at the same time maintaining a very good productivity, compatible with an industrial production.

Although several embodiments of the present invention have been described in a detailed manner, it will be understood that different changes and modifications may be made without going beyond the scope of the invention.

The invention claimed is:

1. A method of forming contacts between at least one metallic layer and at least one semiconductor substrate through at least one layer of dielectric in a semiconductor device, the semiconductor device including, on at least one base face of the semiconductor substrate, the at least one dielectric layer on which is stacked the at least one metallic layer, the method comprising:
    assembling heated ends of plural protruding elements on a support,
    bringing said heated ends into contact with the at least one metallic layer simultaneously, thereby creating zones of melted metal under the heated ends of protruding elements, the melted metal traversing the dielectric and amalgamating with the semiconductor of the substrate at a level of the zones of melted metal, thereby creating the contacts.

2. A method according to claim 1, the protruding elements being arranged in a matrix on the support.

3. A method according to claim 1, the ends of the protruding elements being heated to a temperature between around 577° C. and 1000° C.

4. A method according to claim 1, an application time of the heated ends of the protruding elements against the at least one metallic layer being between around 0.5 second and 10 seconds.

5. A method according to claim 1, between around 500 and 35000 protruding elements being used for a surface area of semiconductor substrate of around 1 m².

6. A method according to claim 1, the ends of the protruding elements being of substantially circular shape, the diameter of which being between around 50 micrometers and 1 millimeter, or substantially of quadrilateral shape, sides of which having a dimension between around 50 micrometers and 1 millimeter.

7. A method according to claim 1, the at least one metallic layer having a thickness of between around 1 micrometer and 5 micrometers.

8. A method according to claim 1, the at least one metallic layer being based on a (loping material, or aluminium.

9. A method according to claim 8, in which the at least one semiconductor substrate is of a first type of conductivity and, during formation of the contacts, the melted metal of the at least one metallic layer creates overdoping zones of the first type of conductivity in the at least one semiconductor substrate, around the metal/semiconductor contacts.

10. A method of forming a semiconductor device, including contacts formed according to the method of claim 1, in which the semiconductor substrate is of a first type of conductivity, the method comprising:
    a) heat treating the at least one semiconductor substrate, forming, under another face opposite to the base, face, an overdoped region of a second type of conductivity, opposite to the first type of conductivity;
    b) forming an antireflective layer on an emitter of the at least one semiconductor substrate;
    c) depositing a metallic grid on the antireflective layer;
    d) bringing into contact the metallic grid with the emitter of the at least one semiconductor substrate through the antireflective layer.

11. A method according to claim 10, the bringing into contact of the metallic grid with the emitter of the at least one semiconductor substrate through the antireflective layer being achieved by a heat treatment of the metallic grid.

12. A method according to claim 10, the metallic grid being based on a noble metal, or silver.

13. A method according to claim 10, the antireflective layer being in silicon nitride or in titanium oxide.

14. A method according to claim 10, the semiconductor device being a solar cell.

15. A device with protruding elements for implementation of the method according to claim 1, comprising protruding elements assembled on a common support, the support including heating means.

16. A device according to claim 15, the ends of the protruding elements being pointed.

17. A device according to claim 15, the protruding elements being formed based on graphite or tungsten.

18. A device according to claim 15, the heating means being a resistive or inductive element.

* * * * *